United States Patent

[11] 3,629,718

[72] Inventors Eberhard Klein; Hans-J Zabel, both of Hildesheim, Germany

[21] Appl. No. 5,047
[22] Filed Jan. 22, 1970
[45] Patented Dec. 21, 1971
[73] Assignee Blaupunkt-Werke GmbH Hildesheim, Germany
[32] Priority Mar. 20, 1969
[33] Germany
[31] P 19 14 071.7

[54] MULTICHANNEL DYNAMIC LEVEL CONTROL CIRCUIT
3 Claims, 1 Drawing Fig.

[52] U.S. Cl. .......... 330/29, 330/30, 330/145
[51] Int. Cl. .......... H03g 3/30
[50] Field of Search .......... 330/29, 30, 84, 124, 145; 179/15 BT, 100.4 ST

[56] References Cited

UNITED STATES PATENTS 2,491,918 12/1949 De Boer et al. .......... 179/1
2,768,249 10/1956 Rockwell .......... 330/145 X
2,935,697 5/1960 McManis .......... 330/145
3,509,289 4/1970 Briskey et al. .......... 330/29 UX

*Primary Examiner*—Robert Segal
*Assistant Examiner*—James B. Mullins
*Attorney*—Flynn & Frishauf

ABSTRACT: To enable use of a single automatic gain control amplifier in stereo, and other multichannel apparatus, a control transistor is provided, having similar input coupling circuits, connected to the various channels, over condenser-diode networks, the diodes being so poled that only a half wave of the signal from any one channel is applied to the control transistor, and signal feed back from one channel to another is inhibited, the serial path between two channels being formed by serially connected, oppositely poled diodes; preferably, the AGC output stage has a center tapped, adjustable resistance as its input, compensation for inequality between amplifier characteristics with respect to the various channels being done by adjusting the exact position of the center tap.

PATENTED DEC 21 1971 3,629,718
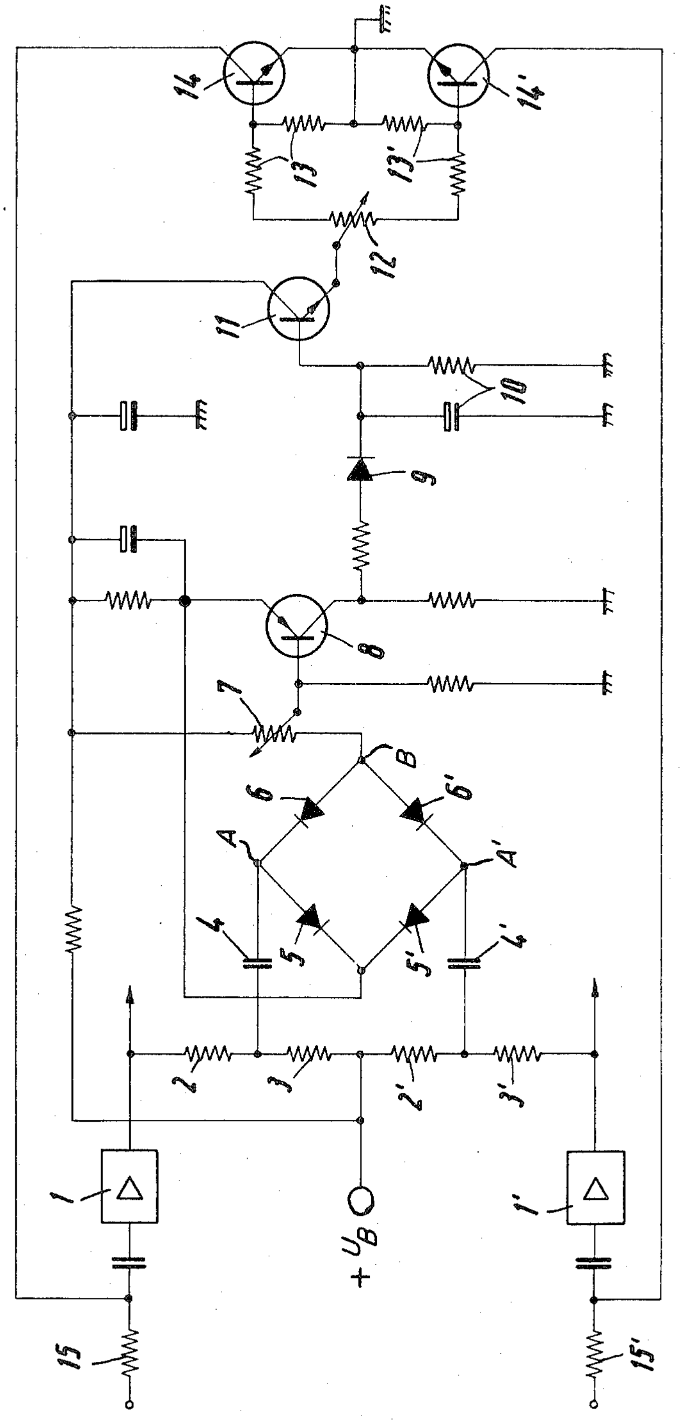
Inventors:
E. KLEIN & H-J. ZABEL
by Flynn & Frishauf
Attys

MULTICHANNEL DYNAMIC LEVEL CONTROL CIRCUIT

The present invention relates to dynamic level control circuits for multichannel amplifiers, and more particularly to regulate the automatic gain control in stereophonic amplifiers.

Dynamic automatic gain control circuits are used in stereophonic amplifiers, phonograph amplifiers, tape amplifiers and the like. Automatic gain control, in single channel equipment, is comparatively simple. When multiple channel equipment is used, particularly in stereophonic apparatus, both channels have to be controlled. Control of both channels must be similar. If a single control circuit is used it must be so constructed that all cross talk or undesired feedback from one channel to the other is effectively prevented.

Most solutions to the requirements of automatic gain control circuits in stereophonic receivers are comparatively complicated, since the various channels required separate isolation amplifiers to decouple the channels, or separate control amplifiers themselves. One such circuit arrangement is shown in German publication paper 1,280,942; entirely apart from the rather large material requirements of such known circuits, it is difficult to adjust these circuits to have exactly identical characteristics, and to compensate for differences in manufacturing tolerances of the components used, so that both channels will operate exactly identically.

It is an object of the present invention to provide a simple and effective circuit for dynamic automatic gain control regulation.

SUBJECT MATTER OF THE PRESENT INVENTION

Briefly, signals from the separate channels are applied over condenser-diode networks to a control amplifier. The condenser-diode combinations are so interconnected, and the diodes are so poled, that only a half wave of any one of the signals from any one of the channels is applied to the control amplifier, for example to the base of a control transistor. This arrangement effectively puts two oppositely poled diodes in series between channels, so that crosstalk and mutual coupling of the channels is effectively prevented.

The circuit of the present invention enables elimination of a separate control amplifier for each channel, the various channels being effectively decoupled. Manufacturing differences in the components used to couple the level-regulating signal back to the channels can easily be accomplished by coupling the output of the network of the present invention through an adjustable center tap of a potentiometer, the terminal ends of which are used to control separate amplifying transistors; by adjusting the exact position of the center tap, manufacturing tolerances between components are effectively balanced.

The structure, organization, and operation of the invention will now be described more specifically with reference to the accompanying drawing, wherein the single FIGURE illustrates a circuit diagram for use in a stereophonic amplifier.

The two channels of the stereophonic amplifiers have been given similar reference numerals, one of them with the numbers primed. Only one channel will be described specifically. The output of one channel amplifier 1 is connected over a voltage divider network 2, 3, to a source of potential $+U_B$. The junction of resistances 2, 3, is connected to a condenser 4, the other end of which connects to a junction A. Junction A is further connected to the anode of a bypass diode 5 and to the cathode of a coupling diode 6. The anode of diode 6 connects with a junction B. Junction B is connected over a variable resistance to the base of a transistor 8. The cathode of bypass diode 5 is connected to the emitter of transistor 8. Similar connections are made in the other channels, diodes 5 and 5′ and 6 and 6′ being oppositely poled.

Transistor 8 is an amplifier stage of known network configuration and amplifies and connects the control signal from the collector of transistor 8 over a network, known by itself, and consisting of a diode 9, and RC time delay network 10 to the base of a further transistor 11. The control signal from transistor 11 is taken off the emitter and applied to the center tap of a potentiometer 12, from which the signal is applied over balancing voltage dividers 13, 13′ to transistors 14, 14′.

Operation: If the signal in one of the two channels 1, 1′ increases excessively, the negative half wave will be applied over condenser 4, charged by diodes 5 or 5′ (or, over condenser 4′, charged by diodes 6, 6′) to the resistance 7, then to the base of transistor 8. A control signal is taken off the collecter, applied over diode 9 and time delay 10 to the base of transistor 11; the emitter of transistor 11 applies a signal over compensating resistance 12 to the transistors 14, 14′. Control of the bases of transistors 14, 14′ will be equalized, the setting of resistance 12 enabling ease of adjustment of the circuit to equalize and compensate for manufacturing tolerances in components. The effective resistance of the collecter-emitter paths of the transistors will change in accordance with the control signal, so that the voltage relationship appearing at resistances 15, 15′ and forming the input to amplifiers 1 will change, to effect automatic gain control. The diodes 6, 6′ or 5, 5′ between junctions A and A′ are oppositely posed, so that the channels are effectively decoupled, a half wave of the signal from the channels being, however, applied to the control transistor 8 over the respective diodes 6, 6′.

An example has been shown with given polarities and known amplifier circuits; other circuits, and utilizing for example reverse connection of the transistor 11, or otherwise poled components may of course be used and are deemed to be within the inventive concept.

We claim:

1. Dynamic level control circuit for multichannel stereophonic amplifiers comprising
   - a first stereo input channel (15, 1);
   - a second stereo input channel (15′, 1′);
   - a single automatic gain control (AGC) amplifier including a control transistor (8);
   - similar first and second coupling circuits (2, 3, 4); (2′, 3′, 4′), from each of said input channels (15, 1), (15′, 1′), including first and second diodes (6, 6′), one each having like first terminals connected to the control electrode of the control transistor (8), the diodes being poled to apply opposite half-wave signals from said channels to the transistor to control said single AGC amplifier by said half-wave signals from the respective first and second channels, but blocking signals from one channel to the other to inhibit mutual interference of said channels;
   - a pair of bypass diodes (5, 5′) having like second electrodes connected together and to the emitter of the control transistor (8);
   - a condenser (4, 4′), each, interconnecting the signals from each said stereo channels and connected to the respective junctions (A, A′) of the first electrodes of the bypass diodes (5, 5′) with the second electrodes of the first and second diodes (6, 6′);
   - and means deriving an output from said control transistor (8) and connecting said output to said channels to affect the gain thereof.

2. Circuit according to claim 1, including an adjustable resistance (7) in the connection between the first and second diodes (6, 6′) and the base of the control transistor (8).

3. Circuit according to claim 1, wherein:
   - the AGC circuit includes a further transistor (11) connected in an amplifying circuit to said control transistor (8);
   - a variable, tapped resistance (12) is provided, having its tap point connected to the emitter-collecter circuit of said further transistor (11);
   - and means (13) are provided interconnecting the end points of said tapped resistance to respective ones of a pair of AGC output transistors, said output transistors controlling the gain of the respective stereo channels.

* * * * *